(12) United States Patent
Lu et al.

(10) Patent No.: US 12,719,464 B2
(45) Date of Patent: Aug. 25, 2026

(54) AUTO-OPTIMIZED DELAY CONTROL FOR DIE-TO-DIE RECEIVER SAMPLING

(71) Applicant: Microsoft Technology Licensing, LLC, Redmond, WA (US)

(72) Inventors: Ping Lu, Cary, NC (US); Eric Douglas Groen, Ankeny, IA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 3 days.

(21) Appl. No.: 19/021,373

(22) Filed: Jan. 15, 2025

(65) Prior Publication Data

US 2026/0205102 A1 Jul. 16, 2026

(51) Int. Cl.
*H03K 5/14* (2014.01)
*H03K 5/135* (2006.01)
*H03K 5/00* (2006.01)

(52) U.S. Cl.
CPC ............... *H03K 5/14* (2013.01); *H03K 5/135* (2013.01); *H03K 2005/00065* (2013.01)

(58) Field of Classification Search
CPC ................................ H03K 5/14; H03K 5/135
USPC ......................................................... 327/276
See application file for complete search history.

(56) References Cited

U.S. PATENT DOCUMENTS 8,816,742 B2 * 8/2014 Patel .................... G11C 29/022
327/276
10,916,278 B1 * 2/2021 Chi ...................... G11C 29/028
2016/0013799 A1 * 1/2016 Li ......................... H03L 7/0812
327/158

OTHER PUBLICATIONS

Invitation to pay additional search fee Received in PCT Application No. PCT/US2025/054253, mailed on Mar. 9, 2026, 14 pages.
International Search Report and Written Opinion received for PCT Application No. PCT/US2025/054253, May 4, 2026, 18 pages.

* cited by examiner

*Primary Examiner* — Tomi Skibinski
(74) *Attorney, Agent, or Firm* — NovoTechIP International PLLC

(57) ABSTRACT

A delay optimizer includes circuits for detecting delay between the received data and the received clock, such as in an integrated circuit having separate dies coupled to communication via an interconnect that includes a clock channel and a data channel. The electrical characteristics of the clock channel and the data channel (including on-chip buffers) may introduce significant differences in the delay between the received clock and the received data coupled with the effects of clock jitter, inter-symbol interference, and duty-cycle distortion that may introduce significant sampling errors in the sampled data. The delay optimizer operates to detect the delay and optimize a sampling clock in real-time and on a continuous basis using the difference between the data edge of the received data and the received clock edge to determine an optimal delay value to sample the received data to produce the sampled data with the desired very-low bit-error-rate (BER).

20 Claims, 7 Drawing Sheets

AUTO-OPTIMIZED DELAY CONTROL FOR DIE-TO-DIE RECEIVER SAMPLING

BACKGROUND

In very large-scale integrated circuit (VLSI) chips, a variety of different subsystems are typically included to form an overall system. Such subsystems are often implemented as in System-on-Chip (SoC) designs in which the SoCs integrate multiple blocks of functionality in a single integrated circuit. For example, the SoC may include one or more processor cores, memory interfaces, network interfaces, optical interfaces, digital signal processors, graphics processors, and telecommunications components. SoC designs are becoming more common in integrated circuits for hyperscale data centers, artificial intelligence (AI) and networking applications that require denser and more reusable functionality that can be combined in the integrated circuit.

Traditionally, each of the blocks are created in one monolithic die. However, for various reasons, such as increasing the yield of functional chips or reducing design complexity and cost, it is increasingly common to separate these blocks into individual die and reconstitute them in a package. To achieve the efficiency and performance of a monolithic die, these individual dies should be highly interconnected. As the sizes of dies shrink and/or the number of input/output pins increases, it is becoming increasingly difficult to scale the interconnects with desired reliability and speed.

The integration of various heterogenous chiplets in a single system can be challenging. For die-to-die partitioning between SoC dies, high density, short channel, wide interconnects are desirable. To address this, post-fabrication redistribution layers (RDL) or fanout layers have been fabricated on top of the chiplets, with fanout layers fabricated to form a fanout wafer. In order for the integrated circuit to achieve reliable performance at faster clock speeds, which may be characterized in terms of a very low bit-error-rate (BER) of the sampled data, techniques for improving the performance of low-latency, short-reach die-to-die (D2D) interconnects are implemented.

The D2D interconnect may be modeled as separate clock channels and data channels to more clearly understand the challenges in achieving the very-low BER necessary for reliable performance in an integrated circuit. Depending on the physical layout of the interconnect, the clock channel and data channel may have significantly different electrical characteristics that create timing and phase differences between the received clock and data obtained at the receiving die. Additional factors such as duty-cycle distortion, supply-induced jitter, and inter-symbol interference may become significant. Variations in power, voltage, and temperature (PVT) may also add additional uncertainty to the timing jitter and contribute to an undesirable BER. Because the received data is sampled according to a sampling clock, and given the limitations of the D2D link to control for timing jitter, it is desirable to achieve the very-low BER by sampling the received data according to the sampling clock at an optimal delay value that is most highly resistant to the timing jitter.

SUMMARY

In one general aspect, the present invention relates to a delay optimizer that includes a delay detector for obtaining received data and a sampling clock, the delay detector producing a charging signal having a first pulse width responsive to a delay between an edge of the received data and a rising edge of the sampling clock, and a discharging signal having a second pulse width responsive to a positive pulse width of the sampling clock. An integrator capacitor provides for developing an output voltage responsive to a current source supplying a charging current to the integrator capacitor responsive to receiving the charging signal and to a current sink supplying a discharging current to the integrator capacitor responsive to receiving the discharging signal. A variable delay receives a received clock and the output voltage at a control input for modulating the delay of the received clock responsive to the output voltage to produce the sampling clock.

In yet another general aspect, the present invention relates to a method for obtaining received data and a sampling clock at a delay detector, producing a charging signal by the delay detector and having a first pulse width responsive to a delay between an edge of the received data and a rising edge of the sampling clock, producing a discharging signal by the delay detector and having a second pulse width responsive to a positive pulse width of the sampling clock. The method further includes supplying a charging current to an integrator capacitor by a current source responsive to receiving the charging signal at a first control input and supplying a discharging current to the integrator capacitor by a current sink responsive to receiving the discharging signal at a second control input, developing an output voltage at the integrator capacitor responsive to the charging current and the discharging current and modulating the delay of a received clock by a variable delay to produce the sampling clock responsive to receiving the output voltage at a control input.

In a further general aspect, the present invention relates to an integrated circuit that includes a first die generating a data signal and a clock signal, a data channel coupled to receive the data signal from the first die, a clock channel coupled to receive the clock signal from the first die, a second die coupled to the data channel and the clock channel, the second die including a delay optimizer that obtains a received clock and produces a sampling clock at an optimal delay value and a sampling receiver that obtains received data and produces sampled data responsive to the sampling clock.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
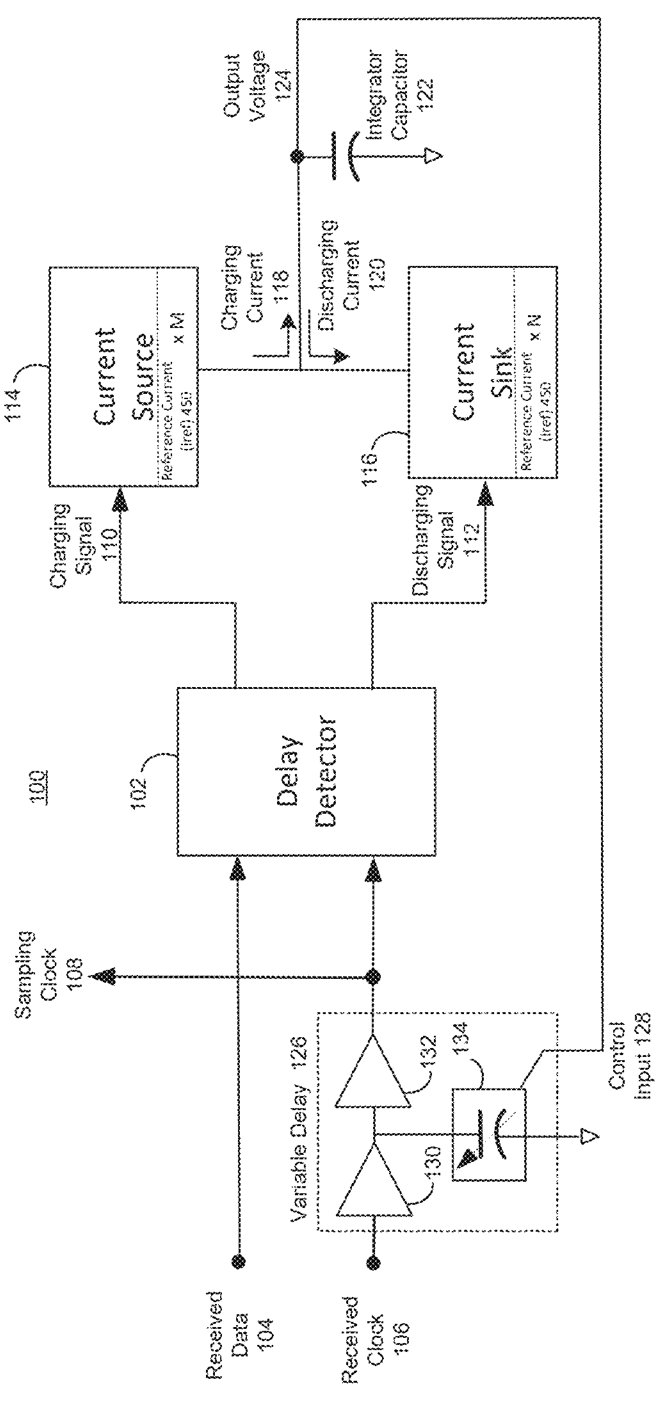
FIG. 1 is a schematic diagram of a delay optimizer according to the disclosure.

Exemplary aspects disclosed herein include delay optimizers that include circuits for detecting delay between received data and received clock, such as in an integrated circuit having separate dies coupled to communication via an interconnect that includes a clock channel and a data channel. Depending on the physical implementation of the interconnect, the electrical characteristics of the clock channel and the data channel may introduce significant differences in the delay between the received clock and the received data. Because the received data is sampled at the receiving die, the delay difference coupled with the effects of clock jitter, inter-symbol interference, and duty-cycle distortion may introduce significant sampling errors in the sampled data, which degrades the bit-error-rate (BER) resulting in degraded performance and reliability of the integrated circuit. Considering the non-periodic characteristics of the received data, simply detecting delay by measuring an average voltage of the phase detector is effective only for an initial period of time when the data is set to clock-pattern. The delay optimizer operates to detect delay and optimize a sampling clock in real-time and on a continuous basis using the difference between the data edge and the received clock edge to determine an optimal delay value to sample the received data to produce the sampled data with the desired very-low BER. The optimal delay value for the edge of the sampling clock, also called the best sampling moment, is approximately in the center of the received data, and farther from the data edges, which provides the maximum resilience to the effects of clock jitter, inter-symbol interference, and duty-cycle distortion.

Further exemplary aspects disclosed herein include the delay optimizer with a current source and a current sink coupled to an integrator capacitor that generates an output voltage responsive to a charging signal and a discharging signal generated by the delay detector. The output voltage is supplied to a variable delay that operates to shift the delay of the received clock in a controlled manner to produce the sampling clock that provides for sampling the received data at the optimal delay value. A selected ratio of charging current generated by the current source to the discharging current generated by the current sink provides for the optimal delay value. The sampling clock is auto-optimized according to the control loop formed by the delay detector, the current source and current sink, the integrator capacitor, and variable delay that operates on the received clock edge and the received data edge.

Further exemplary aspects include the delay optimizer applied in an integrated circuit to improve the operation of the interconnect between a first die and a second die, the interconnect including the data channel and the clock channel. The first die transmits data and clock signals to the second die via the data channel and the clock which the second die obtains as the received data and the received clock. The electrical characteristics of the clock channel and the data channel may introduce significant differences in the delay between the received clock and the received data. Because the received data is sampled at the second die, the delay difference coupled with the effects of clock jitter, inter-symbol interference, and duty-cycle distortion may introduce significant sampling errors in the sampled data, which will degrade the BER resulting in degraded performance and reliability of the integrated circuit. The delay optimizer obtains the received data and the received clock, detects the delay, and provides the sampling clock to a sampling receiver at the optimal delay value to produce the sampled data with the desired very-low BER.

FIG. 1 is a schematic diagram of a delay optimizer 100 that includes a delay detector 102 coupled to obtain received data 104 and a sampling clock 108. The delay detector 102 produces a charging signal 110 provided to a current source 114 and a discharging signal 112 provided to a current sink 116. The current source 114 generates a charging current 118 responsive to the charging signal 110. The current sink 116 generates a discharging current 120 responsive to the discharging signal 112. The current source 114 and the current sink 116 are further coupled to an integrator capacitor 122 that receives the charging current 118 and the discharging current 120 and responsively develop an output voltage 124. The integrator capacitor 122 is further coupled to a variable delay 126 to provide the output voltage 124 to a control input 128. The variable delay 126 obtains the received clock 106 and provides the sampling clock 108 to the delay detector 102 responsive to the output voltage 124 received at a control input 128. A selected ratio of the charging current 118 generated by the current source 114 to the discharging current 120 generated by the current sink 116 provides for the optimal delay value for sampling the received data. The sampling clock 108 is auto-optimized according to the control loop formed by the delay detector 102, the current source 114, the current sink 116, the integrator capacitor 122, and the variable delay 126.

The variable delay 126 further includes an exemplary implantation of a buffer 130 coupled to obtain the received clock 106 and provide an output to a buffer 132. The output of the buffer 130 is further coupled to a varactor 134, which provides a selectable capacitive load to the output of the buffer 130 responsive to the output voltage 124 received at the control input 128. Other circuits, for example a multi-tap delay line for providing a variable delay of the received clock 106 to obtain the sampling clock 108 responsive to the control input 128, may be readily substituted. Further details on the operation of the delay optimizer 100 are provided hereinafter.

Figure 2:
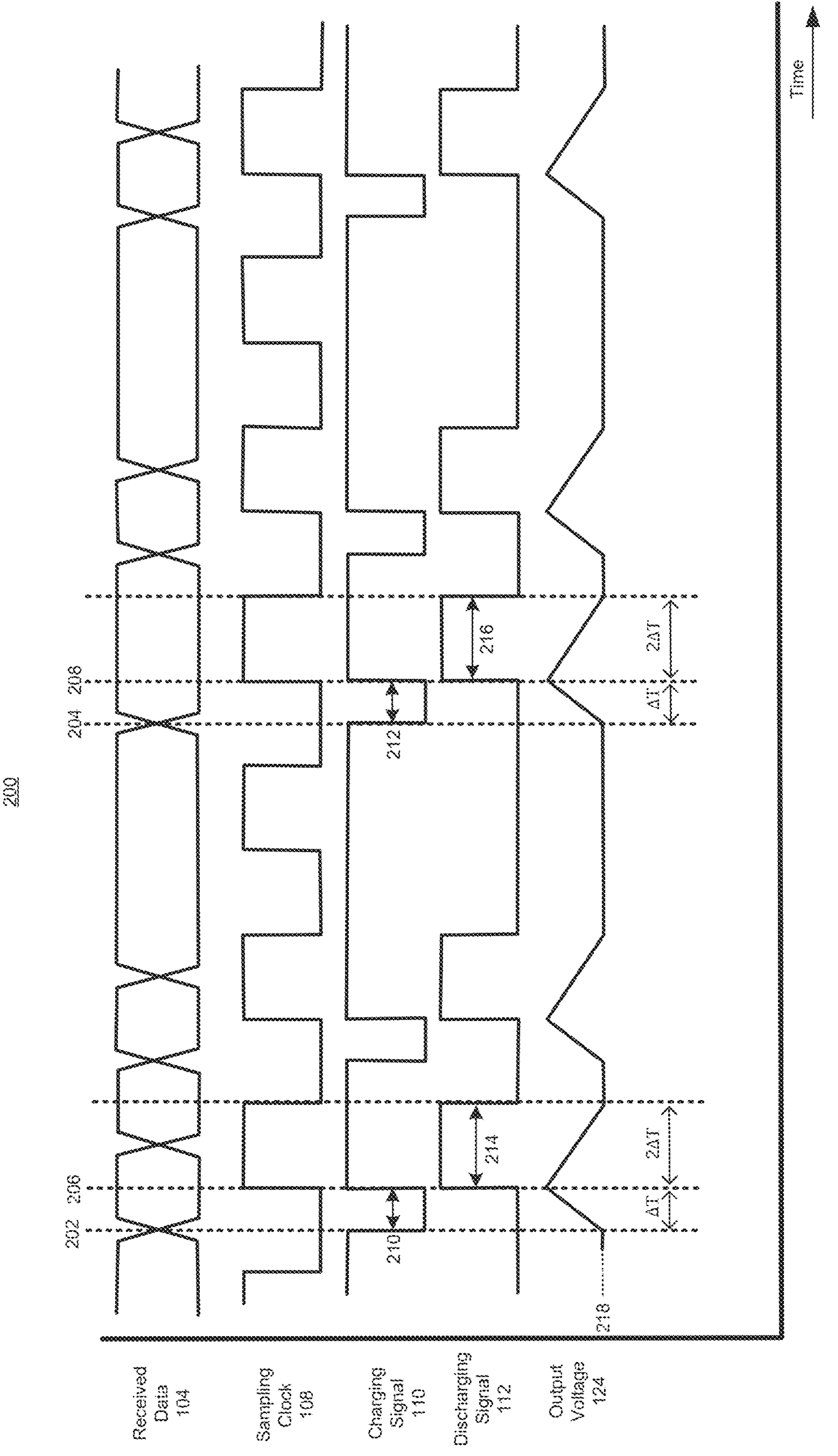
FIG. 2 is an illustration showing the example timing diagram of the operation of the delay optimizer.

FIG. 2 is an illustration showing a diagram 200 of the operation of the delay optimizer 100 shown in FIG. 1. The received data 104 includes data edges 202 and 204. The sampling clock 108 includes rising edges 206 and 208. The charging signal 110 appears as a pulse with charging pulse width 210 and charging pulse width 212, also shown as $\Delta T$ on diagram 200. The discharging signal 112 appears as a positive pulse width of the sampling clock 108, shown as discharging pulse width 214 and discharging pulse width 216, which is also shown as $2\Delta T$ on diagram 200. The output voltage 124 is developed at the integrator capacitor 122 and remains in steady state over time at a target voltage 218 when the following equation is satisfied.

$$Pchar \times Ichar = Pdischar \times Idischar$$

Where Pchar is the charging pulse width 210

Ichar is the charging current 118

Pdischar is the discharging pulse width 214

Idischar is the discharging current 120

The current source 114 is programmed to provide the charging current 118 according to a first integer multiple M of a reference current 450. The current sink 116 is programmed to provide the discharging current 120 according to the second integer multiple M of the reference current 450. The first integer multiple M is twice the second integer multiple N to produce the sampling clock 108 at the optimal delay value.

Figure 3:
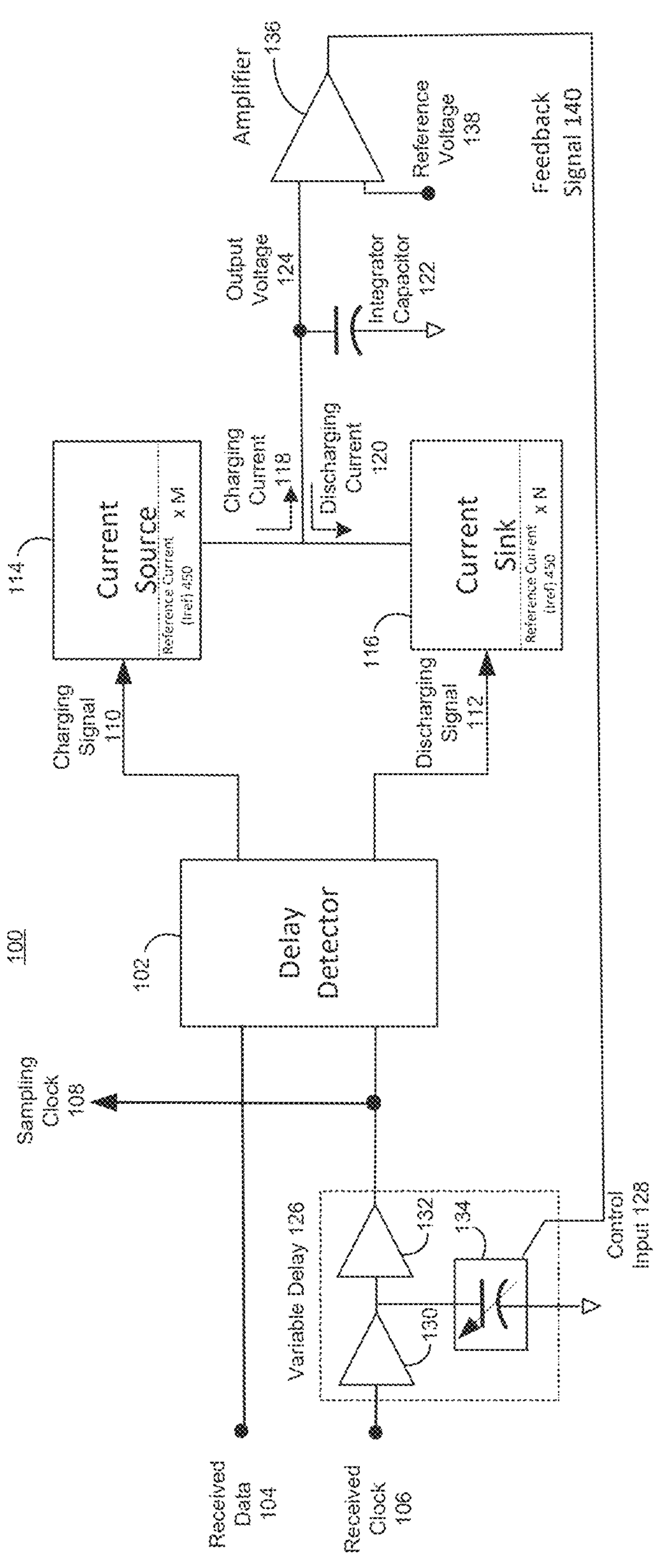
FIG. 3 is a schematic diagram of the delay optimizer of FIG. 1 further including an amplifier.

FIG. 3 is a schematic diagram of the delay optimizer of FIG. 1 further including an amplifier 136 coupled to the integrator capacitor 122 to receive the output voltage 124 and a reference voltage 138 to produce a feedback signal 140 that is provided to the control input 128 of the variable delay 126. All other elements of FIG. 3 are the same as those in FIG. 1 and, for the sake of brevity, will not be described further. The addition of the amplifier 136 provides for additional improvement in the performance of the delay optimizer 100*by* achieving a significantly less mismatch between the charging and discharging current due to gain boosting of the feedback loop now formed by the delay detector 102, the current source 114, the current sink 116, the amplifier 136, and the variable delay 126 to more quickly achieve convergence of the sampling clock 108.

Figure 4:
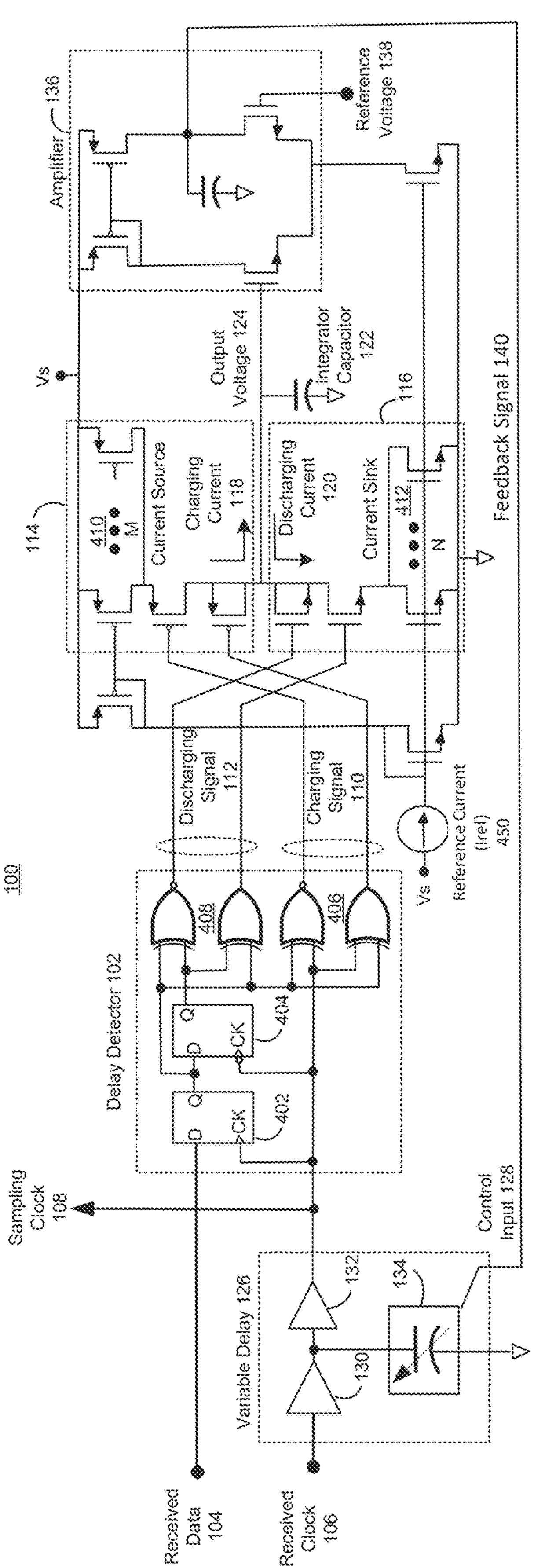
FIG. 4 is a schematic diagram of the delay optimizer of FIG. 2 in an exemplary detailed implementation.

FIG. 4 is a schematic diagram of the delay optimizer 100 of FIG. 2 in an exemplary detailed implementation. The delay detector 102 is coupled to obtain received data 104 and a sampling clock 108. The delay detector 102 further includes a first flip-flop 402 coupled to obtain the received data 104 at a D input and the sampling clock 108 at a CK input and a second flip-flop 404 with a second D input coupled to receive a first Q output of the first flip-flop 402 and the sampling clock 108 at a second CK input. A first pair of XOR gates 406 is coupled to receive the sampling clock 108 and the first Q output of the first flip-flop 402 to provide the charging signal 110 that is supplied differentially from the first pair of XOR gates 406. A second pair of XOR gates 408 is coupled to receive the first Q out of the first flip-flop 402 and a second Q output of the second flip-flop 404 to provide the discharging signal 112 that is supplied differentially from the second pair of XOR gates 408.

The delay detector 102 generates a charging signal 110 provided to the current source 114 and the discharging signal 112 provided to a current sink 116. The current source 114 generates a charging current 118 responsive to the charging signal 110. The current sink 116 generates a discharging current 120 responsive to the discharging signal 112. The current source 114 further includes a plurality of PMOS transistors 410. The current sink 116 includes a plurality of NMOS transistors 412. A first set of the plurality of PMOS transistors 410 corresponding to the first integer multiple M are activated to produce the charging current 118. A second set of the plurality of NMOS transistors 412 corresponding to the second integer multiple N are activated to produce the discharging current 120. The current source 114 is programmed to provide the charging current 118 according to a first integer multiple M of a reference current 450. The current sink 116 is programmed to provide the discharging current 120 according to the second integer multiple N of the reference current 450. The first integer multiple M is twice the second integer multiple N to produce the sampling clock 108 at the optimal delay value.

The current source 114 and the current sink 116 are further coupled to the integrator capacitor 122 that receives the charging current 118 and the discharging current 120 and responsively develop the output voltage 124. The amplifier 136 is coupled to the integrator capacitor 122 to receive the output voltage 124 and a reference voltage 138 to produce a feedback signal 140 that is provided to the control input 128 of the variable delay 126. The variable delay 126 obtains the received clock 106 and provides the sampling clock 108 to the delay detector 102 responsive to the output voltage 124 received at a control input 128. A selected ratio of the charging current 118 generated by the current source 114 to the discharging current 120 generated by the current sink 116 provides for the optimal delay value for sampling the received data. The sampling clock is auto-optimized according to the control loop formed by the delay detector 102, the current source 114, the current sink 116, the integrator capacitor 122, and the variable delay 126.

Figure 5:
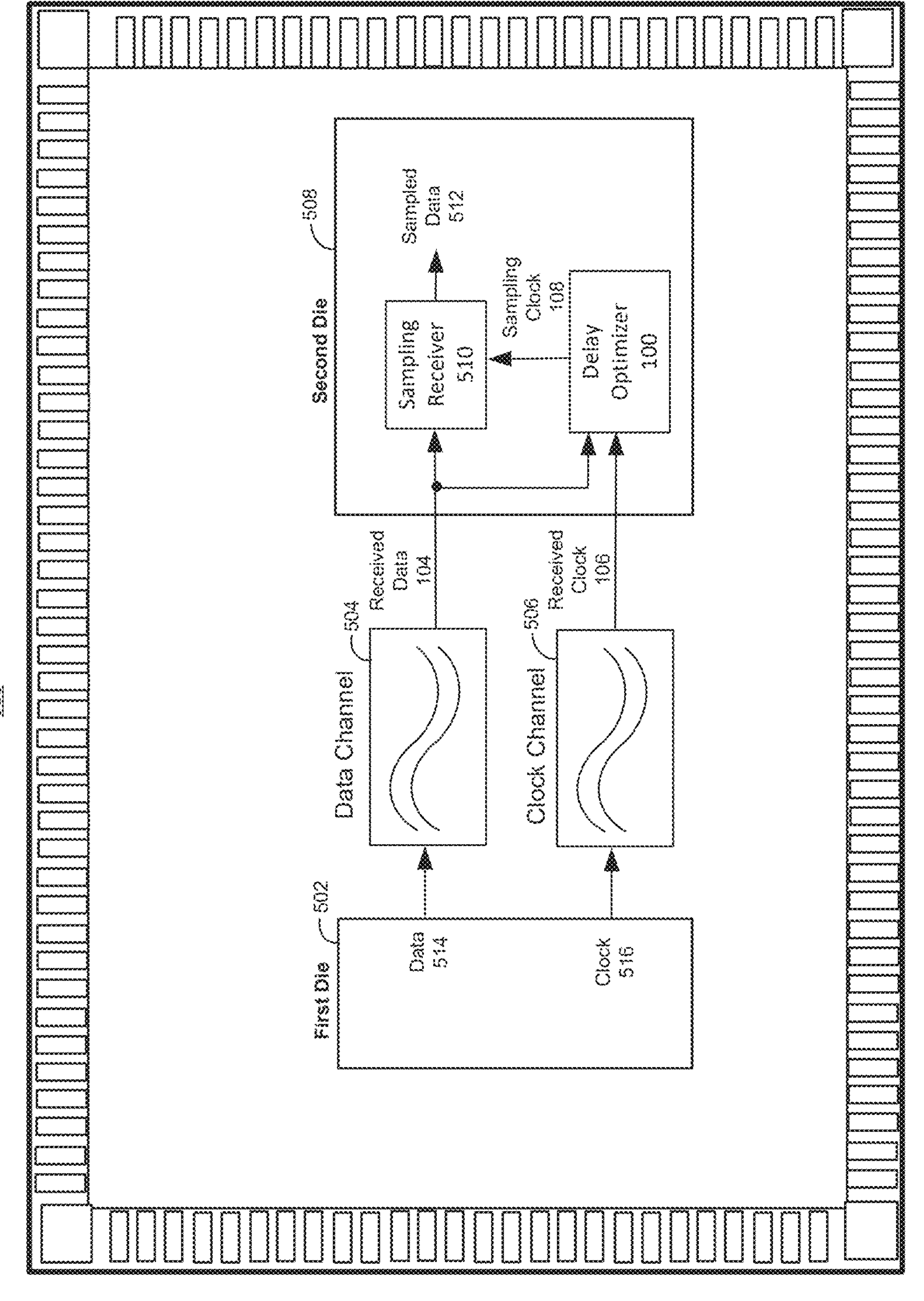
FIG. 5 is a block diagram of an exemplary integrated circuit implementation of the delay optimizer.

FIG. 5 is a block diagram of an integrated circuit 500 as an exemplary implementation of the delay optimizer 100 for improving the die-to-die interconnect by providing the sampling clock 108 at the optimal delay value to produce the sampled data 512 at the desired very-low BER. A first die 502 sends a data signal 514 and a clock signal 516 via a data channel 504 and a clock channel 506. The delay optimizer 100 is coupled to obtain the received data 104 and the received clock 106 to produce the sampling clock 108 as described above. The sampling clock 108 is further provided to a sampling receiver 510 which is coupled to obtain the received data and provide sampled data 512 responsive to the sampling clock 108.

The advantages of the delay optimizer 100 that include continuous background calibration of the optimal delay value and ability to compensate for system offsets such as those between clock channels and data channels can be further adapted to other applications requiring a flexible solution for achieving an optimal delay value, such as between two clock streams, a clock stream and random bit stream, or two random bit streams.

Figure 6:
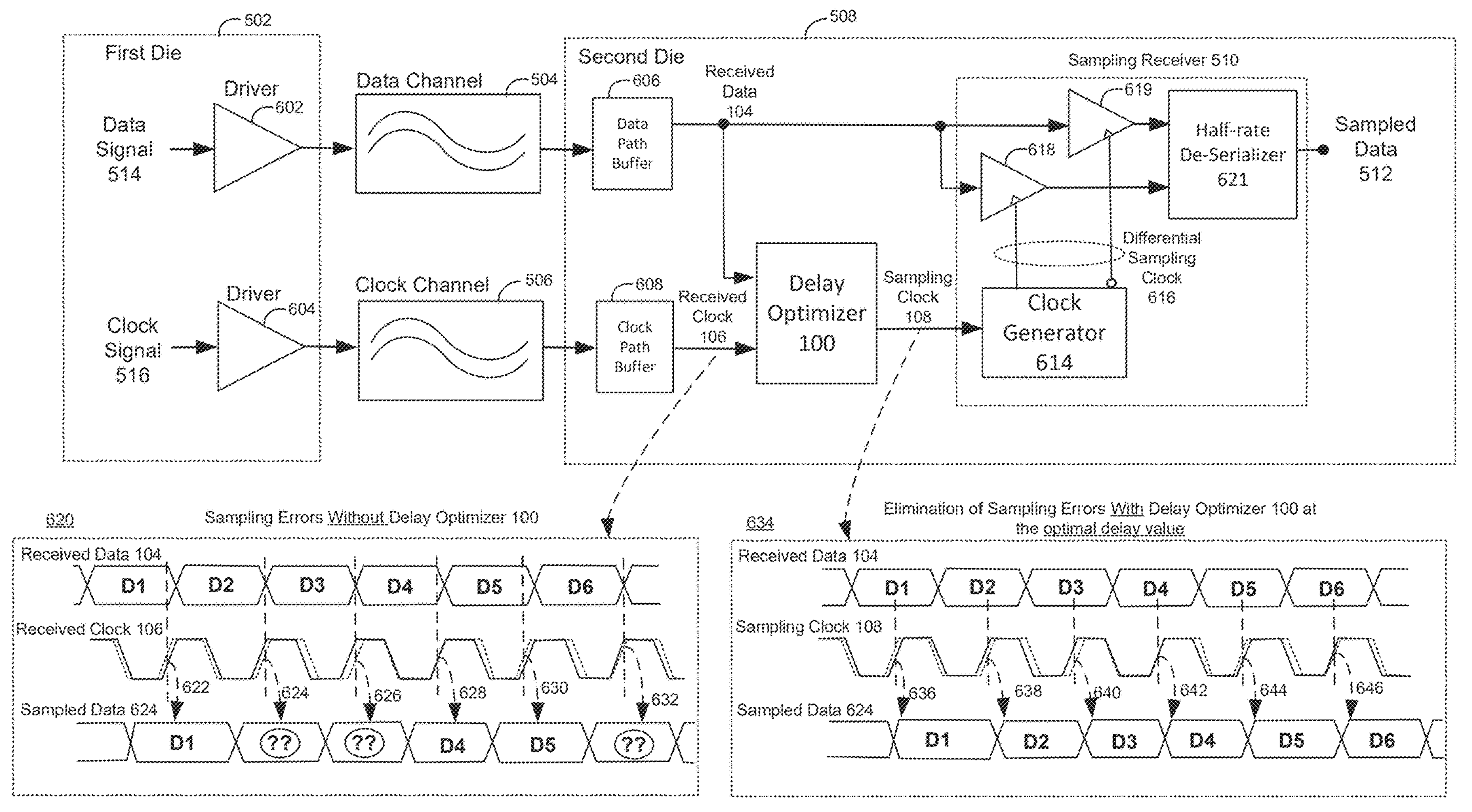
FIG. 6 is a block diagram of the exemplary integrated circuit implementation of the delay optimizer of FIG. 5 shown in additional detail.

FIG. 6 is a block diagram of the exemplary integrated circuit implementation of the delay optimizer of FIG. 5 shown in additional detail. The first die 502 further includes a driver 602 for receiving the data signal 514 and the clock signal 516. The data signal 514 is typically an asymmetrical data stream that has unpredictable patterns and data edges. The clock signal 516 may be a system clock provided across the integrated circuit 500. The second die 508 further includes a data path buffer 606 for obtaining the received data 104 and a clock path buffer 608 for obtaining the received clock 106. The sampling receiver 510 further includes a clock generator 614 coupled to receive the sampling clock 108 and generate a differential sampling clock 616 that is provided to a first data sampler 618 and a second data sampler 619 that sample the received data 104. The outputs of the first data sampler 618 and the second data sampler 619 are provided to a half-rate de-serializer 621 to produce the sampled data 512.

Timing diagram 620 illustrates the technical problem being addressed by the delay optimizer 100 in the application for die-to-die receiver sampling. Depending on the physical layout, the clock channel 506 and the data channel 504 may have significantly different electrical characteristics that create timing and phase differences between the received data 104 and the received clock 106 at a second die 508. Additional factors such as duty-cycle distortion, supply-induced jitter, and inter-symbol interference may become significant. Variations in power, voltage, and temperature (PVT) may add additional uncertainty to the timing jitter and contribute to an undesirable BER in the sampled data 512. The received clock 106, if it were used without the delay optimizer 100 to provide the sampling clock 108, but instead applied directly to the clock generator 614 to time the sampling of the received data 104 at times 622 and 624 would result in sampling errors at times 624, 626, 628, and 632 as shown because the positive edge of the received clock 106 aligns closely with the data edge of the received data 104.

Timing diagram 634 illustrates the technical solution provided by the delay optimizer 100 in the application for die-to-die receiver sampling. The sampling clock 108 generated by the delay optimizer 100 has been optimized as described above for the optimal delay value, which places the sample times 636-646 near the center of the data D1-D6 and away from the data edges to provide the maximum amount of immunity to clock jitter, duty-cycle distortion, supply-induced jitter, and inter-symbol interference. The desired very-low BER of the sampled data 512 at the optimal delay value is thus achieved as a technical solution using the delay optimizer 100 according to the disclosure.

The delay optimizer 100 can be further adapted to compensate for additional delay offsets introduced by the sampling receiver 510. The current source 114 is programmed to provide the charging current 118 according to a first integer multiple M of a reference current 450. The current sink 116 is programmed to provide the discharging current 120 according to the second integer multiple M of the reference current 450. The first integer multiple M is twice the second integer multiple N to produce the sampling clock 108 at the optimal delay value when there is no offset in the sampling receiver 510. New values of M and N can be readily selected to compensate for the offset introduced by the sampling receiver 510.

Figure 7:
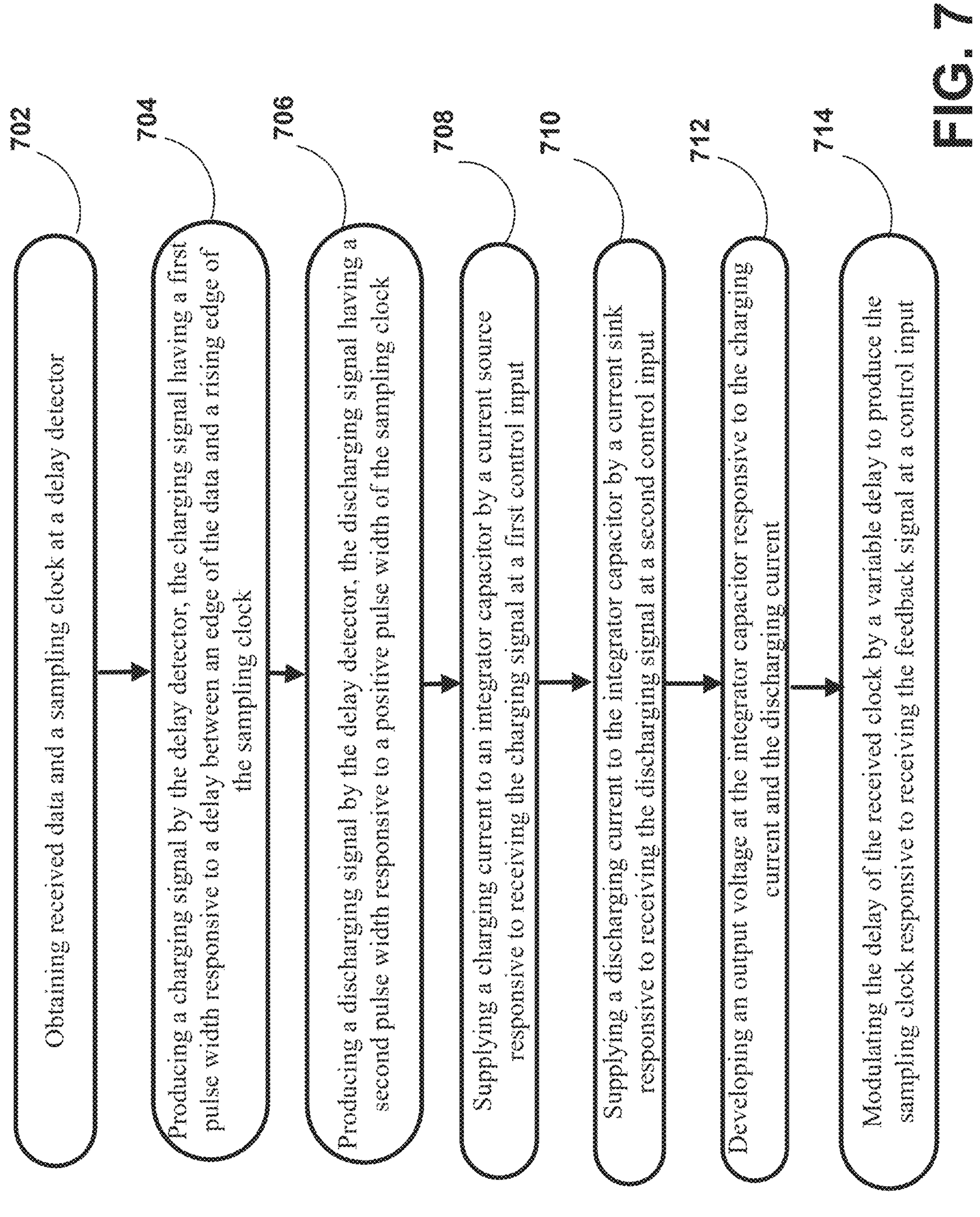
FIG. 7 is a flow chart of an exemplary process for generating a sampling clock according to the techniques disclosed herein.

FIG. 7 is a flow chart of an example process for generating a sampling clock 108 according to the techniques disclosed herein which can be implemented by the delay optimizer 100 as discussed in the preceding examples.

The process 700 includes an operation 702 of obtaining received data 104 and a sampling clock 108 at a delay detector 102. In an exemplary implementation, the delay detector 102 further includes a first flip-flop 402 coupled to obtain the received data 104 at a D input and the sampling clock 108 at a CK input and a second flip-flop 404 with a second D input coupled to receive a first Q output of the first flip-flop 402 and the sampling clock 108 at a second CK input.

The process 700 includes an operation 704 of producing a charging signal 110 by the delay detector 102. The sampling clock 108 includes rising edges 206 and 208. The charging signal 110 appears as a pulse with charging pulse widths 210 and 212, also shown as ΔT on the diagram 200. In an exemplary implementation, a first pair of XOR gates 406 is coupled to receive the sampling clock 108 and the first Q output of the first flip-flop 402 to provide the charging signal 110 that is supplied differentially from the first pair of XOR gates 406.

The process 700 includes an operation 706 of producing a discharging signal 112 by the delay detector 102. The discharging signal 112 appears as a positive pulse width of the sampling clock 108, shown as discharging pulse width 214 and discharging pulse width 216, which is also shown as 2ΔT on the diagram 200. In an exemplary implementation, the delay detector 102 further includes a second pair of XOR gates 408 coupled to receive the first Q out of the first flip-flop 402 and a second Q output of the second flip-flop 404 to provide the discharging signal 112 that is supplied differentially from the second pair of XOR gates 408. The process 700 includes an operation 708 of supplying a charging current 118 to integrator capacitor 122 by a current source 114 responsive to receiving the charging signal 110. In an exemplary implementation, the current source 114 further includes a plurality of PMOS transistors 410. A first set of the plurality of PMOS transistors 410 corresponding to the first integer multiple M are activated to produce the charging current 118. The current source 114 is programmed to provide the charging current 118 according to a first integer multiple M of a reference current 450 The first integer multiple M is twice the second integer multiple N to produce the sampling clock 108 at the optimal delay value.

The process 700 includes an operation 710 of supplying a discharging current 120 to the integrator capacitor 122 by a current sink 116 responsive to receiving the discharging signal 112. In an exemplary implementation, the current sink 116 includes a plurality of NMOS transistors 412. A second set of the plurality of NMOS transistors 412 corresponding to the first integer multiple N are activated to produce the discharging current 120. The current sink 116 is programmed to provide the discharging current 120 according to the second integer multiple N of the reference current 450.

The process 700 includes an operation 712 of developing an output voltage 124 at the integrator capacitor 122 responsive to the charging current 118 and the discharging current 120. The integrator capacitor 122 is coupled to a control input 128 of variable delay 126 to provide the output voltage 124. In an alternative implementation, an amplifier 136 is coupled to the integrator capacitor 122 to receive the output voltage 124 and a reference voltage 138 to produce a feedback signal 140 that is provided to the control input 128 of the variable delay 126.

The process 700 includes an operation 714 of modulating the delay of a received clock by a variable delay 126 to produce the sampling clock 108 responsive to receiving the output voltage 124 at a control input 128. The output voltage 124 remains steady state over time at a target voltage 218 when Pchar×Ichar=Pdischar×Idischar as previously discussed. The variable delay 126 obtains the received clock 106 and provides the sampling clock 108 to the delay detector 102 responsive to the output voltage 124 received at a control input 128. A selected ratio of the charging current 118 generated by the current source 114 to the discharging current 120 generated by the current sink 116 provides for the optimal delay value for sampling the received data. The sampling clock is auto-optimized according to the control loop formed by the delay detector 102, the current source 114, the current sink 116, the integrator capacitor 122, and the variable delay 126.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element. Furthermore, subsequent limitations referring back to "said element" or "the element" performing certain functions signifies that "said element" or "the element" alone or in combination with additional identical elements in the process, method, article or apparatus are capable of performing all of the recited functions.

The disclosure provides many different embodiments, or examples, for implementing different features of the provided subject matter. Specific examples of components and arrangements are described to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. The spatially relative terms are intended to encompass different orientations of the device in use or operation in addition to the orientation depicted in the figures.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A delay optimizer, comprising:

a delay detector for obtaining received data and a sampling clock, the delay detector producing a charging signal having a first pulse width responsive to a delay between an edge of the received data and a rising edge of the sampling clock, and a discharging signal having a second pulse width responsive to a positive pulse width of the sampling clock;

an integrator capacitor for developing an output voltage;

a current source coupled to the integrator capacitor, the current source supplying a charging current to the integrator capacitor responsive to receiving the charging signal;

a current sink coupled to the integrator capacitor, the current sink supplying a discharging current to the integrator capacitor responsive to receiving the discharging signal; and a variable delay having a control input, the variable delay receiving a received clock and the output voltage at the control input and modulating the delay of the received clock responsive to the output voltage to produce the sampling clock.

2. The delay optimizer of claim 1, wherein:

the charging current is a first integer multiple of a reference current;

the discharging current is a second integer multiple of the reference current; and the first integer multiple and the second integer multiple are selected to produce the sampling clock at an optimal delay value.

3. The delay optimizer of claim 2, wherein the first integer multiple is twice the second integer multiple to produce the sampling clock at the optimal delay value.

4. The delay optimizer of claim 2, wherein the current source is programmed to provide the charging current according to the first integer multiple of the reference current and the current sink is programmed to provide the discharging current according to the second integer multiple of the reference current.

5. The delay optimizer of claim 2, wherein the current source includes a plurality of PMOS transistors and the current sink includes a plurality of NMOS transistors, wherein a first set of the plurality of PMOS transistors corresponding to the first integer multiple are activated to produce the charging current and a second set of the plurality of PMOS transistors are activated to produce the discharging current.

6. The delay optimizer of claim 1, further comprising an amplifier coupled to the integrator capacitor to receive the output voltage and a reference voltage, the amplifier producing a feedback signal coupled to the control input of the variable delay.

7. The delay optimizer of claim 1, the variable delay further comprising:

a first buffer coupled to receive the received clock and producing an output;

a varactor coupled to the output of the first buffer and to the control input, wherein the varactor provides a selectable capacitive load to the output of the first buffer responsive to the output voltage; and a second buffer coupled to the output of the first buffer to produce the sampling clock.

8. The delay optimizer of claim 1, the delay detector further comprising:

a first flip-flop coupled to receive the received data and the sampling clock;

a second flip-flop coupled to the first flip-flop and the sampling clock;

a first pair of XOR gates coupled to the first flip-flop and the sampling clock to producing the charging signal; and a second pair of XOR gates coupled to the first flip-flop and the second flip-flop to producing the discharging signal.

9. A method comprising:

obtaining received data and a sampling clock at a delay detector;

producing a charging signal by the delay detector, the charging signal having a first pulse width responsive to a delay between an edge of the received data and a rising edge of the sampling clock;

producing a discharging signal by the delay detector, the discharging signal having a second pulse width responsive to a positive pulse width of the sampling clock;

supplying a charging current to an integrator capacitor by a current source responsive to receiving the charging signal;

supplying a discharging current to the integrator capacitor by a current sink responsive to receiving the discharging signal;

developing an output voltage at the integrator capacitor responsive to the charging current and the discharging current; and modulating the delay of a received clock by a variable delay to produce the sampling clock responsive to receiving the output voltage at a control input.

10. The method of claim 9, further comprising;

selecting the charging current at a first integer multiple of a reference current;

selecting the discharging current at a second integer multiple of the reference current; and producing the sampling clock at an optimal delay value according to the first integer multiple and the second integer multiple.

11. The method of claim 10, further comprising selecting the first integer multiple and the second integer multiple, wherein the first integer multiple is twice the second integer multiple to produce the sampling clock at the optimal delay value.

12. The method of claim 10, further comprising programming the current source to provide the charging current according to the first integer multiple of the reference current and programming the current sink to provide the discharging current according to the second integer multiple of the reference current.

13. The method of claim 9, further comprising:

producing a feedback signal by an amplifier coupled to the integrator capacitor to receive the output voltage and a reference voltage; and providing the feedback signal to the control input of the variable delay.

14. The method of claim 9, further comprising:

obtaining the received clock at a first buffer of the variable delay;

providing a selectable capacitive load by a varactor coupled to an output of the first buffer responsive to the output voltage at the control input; and producing the sampling clock by a second buffer coupled to the output of the first buffer.

15. The method of claim 9, further comprising:

obtaining the received data and the sampling clock by a first flip-flop of the delay detector;

providing a second flip-flop coupled to the first flip-flop and the sampling clock;

providing the charging signal by a first pair of XOR gates coupled to the first flip-flop and the sampling clock; and providing the discharging signal by a second pair of XOR gates coupled to the first flip-flop and the second flip-flop.

16. An integrated circuit, comprising:

a first die generating a data signal and a clock signal;

a data channel coupled to receive the data signal from the first die;

a clock channel coupled to receive the clock signal from the first die;

a second die coupled to the data channel and the clock channel, the second die including:

a delay optimizer that obtains a received clock and produces a sampling clock at an optimal delay value; and a sampling receiver that obtains received data and produces sampled data responsive to the sampling clock.

17. The integrated circuit of claim 16, the sampling receiver further comprising:

a first data sampler and a second data sampler coupled to obtain the received data;

a clock generator coupled to receive the sampling clock from the delay optimizer and provide a differential sampling clock to the first data sampler and the second data sampler; and a half-rate de-serializer coupled to the first data sampler and the second data sampler to produce to the sampled data.

18. The integrated circuit of claim 16, the delay optimizer further comprising:

a delay detector that obtains the received data and the sampling clock, the delay detector producing a charging signal, the charging signal having a first pulse width responsive to a delay between an edge of the received data and a rising edge of the sampling clock, and a discharging signal, the discharging signal having a second pulse width responsive to a positive pulse width of the sampling clock;

an integrator capacitor for developing an output voltage;

a current source coupled to the integrator capacitor, the current source supplying a charging current to the integrator capacitor responsive to receiving the charging signal;

a current sink coupled to the integrator capacitor, the current sink supplying a discharging current to the integrator capacitor responsive to receiving the discharging signal; and a variable delay having a control input, the variable delay receiving the received clock and the output voltage at the control input and modulating the delay of the received clock responsive to the output voltage to produce the sampling clock.

19. The integrated circuit of claim 18, wherein:

the charging current is a first integer multiple of a reference current;

the discharging current is a second integer multiple of the reference current; and the first integer multiple and the second integer multiple are selected to produce the sampling clock at the optimal delay value.

20. The integrated circuit of claim 19, wherein the first integer multiple is selected to be twice the second integer multiple to produce the sampling clock at the optimal delay value.

* * * * *